United States Patent [19]

Suzuki

[11] Patent Number: 4,852,125
[45] Date of Patent: Jul. 25, 1989

[54] ADAPTIVE QUANTIZING DEVICE FOR USE IN A DIFFERENTIAL ENCODER

[75] Inventor: Norio Suzuki, Tokyo, Japan
[73] Assignee: NEC Corporation, Tokyo, Japan
[21] Appl. No.: 161,143
[22] Filed: Feb. 26, 1988
[30] Foreign Application Priority Data

Feb. 26, 1987 [JP] Japan .................................. 62-41324
Jun. 20, 1987 [JP] Japan ................................ 62-152433

[51] Int. Cl.$^4$ .............................................. H03M 3/04
[52] U.S. Cl. ........................................ 375/30; 341/76
[58] Field of Search ....................... 375/25, 26, 27, 28, 375/30, 33; 332/11 D; 382/50; 341/51, 58, 76

[56] References Cited

U.S. PATENT DOCUMENTS

| | | | |
|---|---|---|---|
| 3,422,227 | 1/1969 | Brown | 375/27 |
| 3,550,004 | 12/1970 | Candy | 375/33 |
| 4,607,281 | 8/1986 | Starck | 375/33 |
| 4,612,654 | 9/1986 | De Freitas | 375/33 |
| 4,626,828 | 12/1986 | Nishitani | 375/30 |

OTHER PUBLICATIONS

Bostelmann, "A Simple High Quality DPCM-Codec for Video Telephony Using 8 Mbit per Second", *NTZ*, vol. 27 (1974), No. 3, pp. 115–117.

*Primary Examiner*—Benedict V. Safourek
*Attorney, Agent, or Firm*—Foley & Lardner, Schwartz, Jeffery, Schwaab, Mack, Blumenthal & Evans

[57] ABSTRACT

An adaptive quantizing device for use in a differential encoder which makes use of a device input signal variable in a predetermined dynamic range, a local decoded signal, and a local input signal from a prediction signal. The quantizing arrangement (12, 13) is provided for adaptively quantizing a difference between the device and the local input signals into a quantization output signal in accordance with a predetermined quantization characteristic so that the local decoded signal never exceeds the dynamic range even if the quantization output signal is accompanied by a quantization error of a maximum value. Preferably, the quantizing arrangement comprises a converting circuit (16) for quantizing the device input signal into a converted signal in accordance with a preselected quantization characteristic for use in making a single quantizer (13) adaptively quantize the difference into the quantization output signal. Alternatively, the quantizing arrangement may comprise three quantizers and a selecting arrangement for adaptively selecting one of outputs of the three quantizers. A read-only memory is preferred in implementing each of the single quantizer, the converting circuit, the three quantizers, and a combination of the three quantizers and the selecting arrangement.

11 Claims, 2 Drawing Sheets

ADAPTIVE QUANTIZING DEVICE FOR USE IN A DIFFERENTIAL ENCODER

BACKGROUND OF THE INVENTION

This invention relates to a quantizing device for use in a differential encoder in quantizing a device input signal into a quantization output signal.

In the manner known in the art, the differential encoder is preferred on encoding a picture signal representative of a succession of picture elements. Each picture element is often abbreviated to a "pel". Such an input signal is supplied to the quantizing device as the above-mentioned device input signal and is variable in a predetermined dynamic range. More particularly, the device input signal represents a signal value which is variable from one pel to another or from a current sampling instant to a next subsequent sampling instant between an upper limit and a lower limit which are different or are spaced apart by the dynamic range.

It is known in the art that the quantizing device comprises a quantizing arrangement supplied with the device input signal and a local input signal which will presently be described. The quantizing arrangement is for quantizing each difference between the device input signal and the local input signal into the quantization output signal with a quantization error which is alternatively called quantization noise. An adder is used in calculating a sum of the quantization output signal and the local input signal to produce a local decoded signal representative of the sum. Responsive to the local decoded signal, a predictor produces a prediction signal predictive of the device input signal. By way of example, a one-pel delay is used as the predictor in predicting for a signal value representative of a current picture element another signal value which the device input signal will have in representing a next subsequent picture element. The prediction signal is supplied to the quantizing arrangement as the local input signal.

It is usual to use a subtracter responsive to the device input signal and the local input signal, namely, the prediction signal, in producing a differential signal representative of the difference. The quantization output signal represents from time to time a predetermined one of quantization levels which are related to various values of the difference in accordance with a predetermined quantization characteristic. In a counterpart decoder, a decoded signal is obtained in the manner in which the local decoded signal is derived in the quantizing device. From the decoded signal, the device input signal is reproduced as a reproduced signal.

For such a quantizing device, it is possible to represent each signal value by a preselected number of binary bits. The preselected number will hereafter be denoted in general by N. In this event, the upper limit is represented by $(2^{N-1} - 1)$ and the lower limit, by $(-2^{N-1})$. The dynamic range is between $(2^{N-1} - 1)$ and $(-2^{N-1})$, both inclusive, namely, is $2^N$ wide. The differential signal is represented by $(N+1)$ or more binary bits. A great number has been used as the predetermined number of the quantization levels in order to prevent the reproduced signal from degrading due to quantization noise at each flat portion of the device input signal and due to overload of the quantizing device.

With a view to reducing the predetermined number to a smaller number, an improved quantizing device is described in an article contributed by Gert Bostelmann to a German technical periodical "NTZ," Volume 27 (1974), No. 3, pages 115 to 117, under the title of "A Simple High Quality DPCM-Codec for Video Telephone Using 8 Mbit per Second." According to the Bostelmann article, an input signal is preliminarily subject to amplitude limitation before used as the device input signal. The amplitude limitation is such that the local decoded signal may never exceed the dynamic range even if the quantization error has its greatest absolute value. More specifically, the amplitude limitation is for making the device input signal have a limited range between the upper limit less the greatest absolute value and the lower limit plus the greatest absolute value. It is possible with the amplitude limitation to make the quantizing arrangement quantize the differential signal of N binary bits. In addition, calculation is carried out with respect to a modulus of the preselected number in the adder for deriving the local decoded signal and also in the subtracter for deriving the differential signal.

The quantizing device of Bostelmann is excellent in that a smaller number is sufficient as the predetermined number of the quantization levels. The local decoded signal is, however, subjected to the amplitude limitation. The decoded signal is accordingly subjected to the amplitude limitation. This degrades the reproduced signal.

If the greatest absolute value of the quantization error is thirty-two in the Bostelmann quantizing device, the amplitude limitation results in a loss of thirty-two from each of the upper and the lower limits. When the dynamic range is 256 wide, as much as 12.5°/o is lost in each of positive and negative parts of the decoded signal. The decoded signal is therefore subjected to a serious degradation.

SUMMARY OF THE INVENTION:

It is therefore an object of the present invention to provide a quantizing device for use in a differential encoder, which device is capable of dealing with a device input signal having a predetermined dynamic range and subjected to no amplitude limitation and in which device a local decoded signal will never exceed the dynamic range even if a quantization error has a greatest absolute value.

Other objects of this invention will become clear as the description proceeds.

A quantizing device to which this invention is applicable, comprises quantizing unit responsive to a device input signal variable in a predetermined dynamic range and a local input signal for quantizing each difference between the device input signal and the local input signal into a quantization output signal with a quantization error, an adder for calculating a sum of the quantization output signal and the local input signal to produce a local decoded signal representative of the sum, a predictor responsive to the local decoded signal for producing a prediction signal predictive of the device input signal, and a unit for supplying the prediction signal to the quantzing means as the local input signal.

According to this invention, the above-described quantizing unit is for adaptively quantizing the difference into the quantization output signal so that the local decoded signal never exceeds the dynamic range even if the quantization error has a greatest absolute value.

In the manner described heretobefore, the device input signal represents a signal value variable between an upper limit and a lower limit which are different by the dynamic range. In other words, the upper and the lower limits are spaced apart by the dynamic range.

According to an aspect of this invention, the quantizing means comprises: (A) a converting circuit for converting the device input signal to a converted signal representative of upper values and lower values when the signal value is in an upper region between the upper limit and a first value which is equal to the upper limit less the greatest absolute value and when the signal value is in a lower region between the lower limit and a second value which is equal to the lower limit plus the greatest absolute value, respectively, the converted signal representing at least one intermediate value when the signal value is in an intermediate region which is neither the upper region nor the lower region; and (B) a quantizer responsive to the converted signal for quantizing the difference into the quantization output signal in accordance with a predetermined quantization characteristic with no change and with an adaptive change when the converted signal represents the above-mentioned at least one intermediate value and when the converted signal represents either of the upper values and the lower values, respectively, the adaptive change being in compliance with the upper and the lower values so that the local decoded signal never exceeds the dynamic range even if the quantization error has the greatest absolute value.

Like the signal value, the difference is variable between a greatest value and a least value. The predetermined quantization characteristic is for making the quantization output signal represent for the difference a selected one of a predetermined number of quantization levels that becomes a highest level and a lowest level when the difference is equal to the greatest and the least values, respectively.

According to an example of the quantizing device of the above-described aspect of this invention, the adaptive change is for making the quantization output signal represent a changed one of the quantization levels that is one quantization step lower and higher than the selected one of the quantization levels when it is possible that the local decoded signal upwardly exceeds the upper limit and downwardly exceeds the lower limit, respectively.

According to another example of the quantizing device according to the aspect being described, the adaptive change is for making the quantization output signal represent a changed one of the quantization levels for the difference that is one quantization step different from the selected one of the quantization levels in compliance with the upper and the lower values so that the local decoded signal never exceeds the dynamic range even if the quantization error has the greatest absolute value.

According to another aspect of this invention, the afore-described quantizing means comprises: (A) a zeroth quantizer for quantizing the difference into a zeroth quantized signal representative of a selected one of a predetermined number of quantization levels in accordance with a predetermined quantization characteristic; (B) a first quantizer for quantizing the difference into a first quantized signal representative of a lower level which is one quantization step lower than the selected one of the quantization levels; (C) a second quantizer for quantizing the difference into a second quantized signal representative of a higher level which is one quantization step higher than the selected one of the quantization levels; and (D) selecting means responsive to the device input signal, the difference, and the zeroth quantized signal for adaptively selecting one of the zeroth, the first, and the second quantized signals as the quantization output signal when the local decoded signal does not exceed the dynamic range even if the quantization error has the greatest absolute value, when it is possible that the local decoded signal upwardly exceeds the upper limit, and when it is possible that the local decoded signal downwardly exceeds the lower limit, respectively.

According to still another aspect of this invention, the above-described quantizing means is a read-only memory having a plurality of memory locations which are selectively accessed by an address signal and at which a plurality of reference quantization levels and a plurality of changed quantization levels are preliminarily stored, the reference quantization levels being related to the difference in accordance with a predetermined quantization characteristic, the changed quantization levels being one quantization step different from the respective reference quantization levels, the device input signal and the local input signal being collectively used as the address signal in making the read-only memory produce the quantization output signal with the quantization output signal made to adaptively represent one of the reference quantization levels and one of the changed quantization levels in response to the difference when a sum of the device input signal and the above-mentioned one of the reference quantization levels does not exceed the dynamic range even if the quantization error has the greatest absolute value and when it is possible that the sum exceeds the dynamic range, respectively.

DESCRIPTION OF THE PREFERRED EMBODIMENTS

Figure 1:
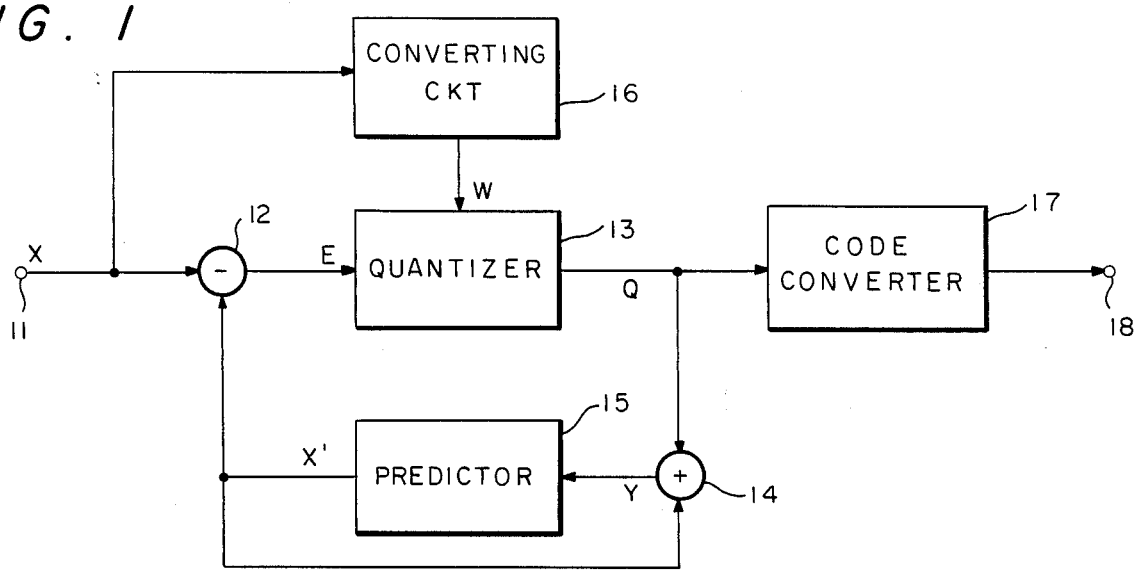
FIG. 1 is a block diagram of a differential encoder which comprises a quantizing device according to a first embodiment of the instant invention.

Referring to FIG. 1, a differential encoder comprises a quantizing device according to a first embodiment of the present invention. The differential encoder has an encoder input terminal which is used also as a device input terminal 11 of the quantizing device. The device input terminal 11 is supplied with a device input signal X which is typically a picture signal, such as a television signal, representative of a succession of picture elements or pels. It will be assumed that the input signal X has at each instant of time a signal value which is represented by a preselected number of binary bits.

When the preselected number is denoted by N in general, the signal value is variable from one pel to another pel or from a current sampling instant to a next subsequent sampling instant between an upper limit ($2^{N-1} - 1$) and a lower limit ($-2^{N-1}$), both inclusive, on both positive and negative sides of zero. The input signal X therefore has a predetermined dynamic range, $2^N$ wide. In other words, the upper and the lower limits are different or are spaced apart by the dynamic range.

The quantizing device comprises a device subtracter 12 supplied with the device input signal X and a local input signal X' which will become clear as the description proceeds. Calculating a difference between the device and the local input signals X and X', the subtracter 12 produces a differential signal E representative of the difference. Depending on the local input signal X', the differential signal E represents various differences for a single signal value of the device input signal X. In any event, the difference is variable between a greatest value and a least value. In the manner which will later be exemplified, the greatest and the least values are equal to the upper and the lower limits.

It should be noted in this connection that the local input signal X' and the differential signal E are represented according to this invention also by the preselected number N of binary bits. This is because the subtracter 12 calculates the difference with respect to a modulus of the preselected number N in the manner described in the Bostelmann article referred to hereinabove. The local input signal X' is calculated also modulo the preselected number N as will later be described.

A quantizer 13 is for quantizing the differential signal E into a quantization output signal Q in accordance with a predetermined quantization characteristic defining a predetermined number of quantization levels or treads in the manner which will later be exemplified together with level numbers assigned to the respective quantization levels. According to the quantization characteristic, each difference is quantized into a selected one of the quantization levels that will be termed a selected level and becomes a highest level and a lowest level when the difference is equal to the greatest and the least values, respectively. Two adjacent ones of the quantization levels are spaced apart by a quantization step or rise which depends on the quantization characteristic.

In the manner known in the art, the quantization levels are less in number than the above-described various differences represented by the differential signal E from time to time. The quantization output signal Q is therefore accompanied by a quantization error Qe which is given by subtracting the differential signal E from the quantization output signal Q when the differential signal E is derived by subtracting the local input signal X' from the device input signal X. The quantization error Qe is ordinarily known as quantization noise in the art. Although dependent on the quantization characteristic, the quantization error Qe is usually small when the difference is equal to zero or adjacent to zero. When the difference is near to the greatest or the least value, the quantization error Qe has a greatest or maximum absolute value Qa which depends on the manner in which the signal value varies with time.

A device adder 14 is used in calculating a sum of the quantization output signal Q and the local input signal X' to produce a local decoded signal Y representative of the sum. In the manner described before, the sum is calculated with respect to the modulus of the preselected number N. Responsive to the local decoded signal Y, a predictor 15 produces a prediction signal which is usually denoted by $\hat{X}$ in the art and is predictive of the device input signal X in accordance with a predetermined prediction characteristic. By way of example, the predictor 15 is a one-pel delay for use in predicting for a signal value representive of a current picture element another signal value which the device input signal X will have in representing a next subsequent picture element. The prediction signal is supplied to the device subtracter 12 as the local input signal X'.

Attention should be directed in connection with the quantizing device being illustrated to the fact that the device input signal X is delivered from the device input terminal 11 not only to the device subtracter 12 but also to a converting circuit 16 which is for converting the input signal X to a converted signal W in accordance with a preselected conversion characteristic. In the manner which will presently be exemplified, the conversion characteristic is for making the converted signal W carry information related to the signal value of the input signal X with the information represented by binary bits which are less in number than the preselected number N.

Generally speaking, the converted signal W represents, as a part of the information, a prescribed number of upper values and a like number of lower values when the signal value of the device input signal X is in an upper region and a lower region, respectively. It will shortly be exemplified that the upper region is between the upper limit of the signal value and a first value which is equal to the upper limit less the greatest absolute value Qa. The lower region is between the lower limit and a second value which is equal to the lower limit plus the greatest absolute value Qa. When the signal value is in an intermediate region which is neither the upper region nor the lower region, the converted signal W represents at least one intermediate value as a remaining part of the information.

The converted signal W is delivered to the quantizer 13. In response to the converted signal W, the quantizer 13 adaptively quantizes the difference into the selected level, namely, into one of the quantization levels, so that the local decoded signal Y never exceeds the dynamic range of the device input signal X even if the quantization error Qe has the greatest absolute value Qa.

More particularly, the predetermined quantization characteristic of the quantizer 13 is used with no change as it is when the converted signal W represents the above-mentioned at least one intermediate value. In other words, the quantization output signal Q represents in this event the selected level as it stands. When the converted signal W represents either the upper values or the lower values, the quantization characteristic is subjected to an adaptive change in compliance with the upper and the lower values so that the local decoded signal Y never exceeds the dynamic range even if the quantization error Qe has the greatest absolute value Qa.

For example, the quantization output signal Q represents a changed one of the quantization levels that will be called a changed level and is one quantization step lower than the selected level when it is possible that the local decoded signal Y upwardly exceeds the upper limit to represent a value which is equal to $2^{N-1}$ or greater. On the other hand, the changed level is one quantization step higher than the selected level when it is possible that the local decoded signal Y downwardly exceeds the lower limit to represent a value which is equal to ($-2^{N-1} - 1$) or less.

A little bit more in general, the changed level is one quantization step different from the selected level, namely, one quantization step higher or lower, in compliance with the upper and the lower values, so that the local decoded signal Y never exceeds the dynamic range even if the quantization error Qe has the greatest absolute value Qa. Under the circumstances, the adaptive change is to substitute the lowest level for the highest level when the selected level is the highest level and moreover when it is possible that the local decoded signal Y upwardly exceeds the upper limit. The highest level is substituted for the lowest level when the selected level is the lowest level and furthermore when it is possible that the local decoded signal Y downwardly exceeds the lower limit.

In the manner thus far described, the quantizing device supplies a code converter 17 with the quantization output signal Q which is adaptively produced by the quantizer 13 to represent either the selected level or the changed level. In the known manner, the code converter 17 converts the quantization output signal Q to a code signal representative of the level numbers described before. With addition of a synchronizing signal to the code signal, the code converter 17 delivers an encoder output signal towards a counterpart decoder (not shown) through an encoder output terminal 18.

In the decoder, the encoder output signal is decoded into a decoded signal. In the manner known in the art, the decoded signal is similar to the local decoded signal Y. It will now be clearly appreciated that neither the local decoded signal Y nor the decoded signal suffers from the amplitude limitation which was carried out according to the above-referenced Bostelmann article. Accordingly, it is possible with this invention to make a reproduction of the device input signal X have as wide a dynamic range as the device input signal X and have an unexpectedly excellent quality. Moreover, the local decoded signal Y is limited to the dynamic range of the device input signal X as a result of the adaptive quantization. In other words, the quantization error Qe is always small. Consequently, excessive overload never occurs.

It will now be presumed that the device input signal X is represented by eight binary bits and accordingly that the preselected number N is equal to eight. Each of the local input signal X' and the differential signal E is represented also by eight binary bits.

The quantizer 13 may be of the 4.5-bit midtread type known in the art and will later be discussed. Herein, 4.5 bits are used because two samples of nine binary bits in total are collectively encoded by the code converter 17. At any rate, the quantizer 13 quantizes the differential signal E into the quantization output signal Q in the manner which is given in Table 1 hereunder with the quantization levels represented by Q(i) where i represents the level number between a highest level number 10 and a lowest level number (−10). When desired, the quantization level Q(i) of the level number i will be called an i-th quantization level.

TABLE 1

| Differential Signal E | Quantization Output Signal Q |
| --- | --- |
| 84 to 127 | Q(10):96 |
| 62 to 83 | Q(9):72 |
| 44 to 61 | Q(8):52 |
| 30 to 43 | Q(7):36 |
| 20 to 29 | Q(6):24 |
| 13 to 19 | Q(5):16 |
| 8 to 12 | Q(4):10 |
| 5 to 7 | Q(3):6 |
| 2 to 4 | Q(2):3 |

TABLE 1-continued

| Differential Signal E | Quantization Output Signal Q |
| --- | --- |
| 1 | Q(1):1 |
| 0 | Q(0):0 |
| −1 | Q(−1):−1 |
| −4 to −2 | Q(−2):−3 |
| −7 to −5 | Q(−3):−6 |
| −12 to −8 | Q(−4):−10 |
| −19 to −13 | Q(−5):−16 |
| −29 to −20 | Q(−6):−24 |
| −4 to −30 | Q(−7):−36 |
| −61 to −44 | Q(−8):−52 |
| −83 to −62 | Q(−9):−72 |
| −128 to −84 | Q(−10):−96 |

It will be assumed that the greatest absolute value Qa of the quantization error Qe is equal to seven for the predetermined prediction characteristic of the predictor 15 and for the device input signal X which varies in a certain manner. A specific example of the conversion characteristic is given below as regards the device input signal X and fifteen conversion levels of the converted signal W which can be represented by four binary bits.

TABLE 2

| Input Signal X | Conversion Level |
| --- | --- |
| 127 | 0 |
| 126 | 1 |
| 125 | 2 |
| 124 | 3 |
| 123 | 4 |
| 122 | 5 |
| 121 | 6 |
| −121 to 120 | 7 |
| −122 | 8 |
| −123 | 9 |
| −124 | 10 |
| −125 | 11 |
| −126 | 12 |
| −127 | 13 |
| −128 | 14 |

According to Table 2, the signal value of the device input signal X is used with no change as one of the upper values and the lower values of the converted signal W when the signal value is in the upper region between 127 and 121 or in the lower region between (−128) and (−122). The upper values are represented by the conversion levels between 0 and 6 and the lower values, by the conversion levels between 8 and 14. In the intermediate region between 120 and (−121), the signal value is represented by a single intermediate value of the conversion level 7. It is possible to regard such a conversion characteristic as one of various preselected quantization characteristics.

It will now be assumed that the greatest absolute value Qa to equal to thirty-two for the prediction characteritic and for the device input signal X which varies in a certain manner. It is preferred in this event that the conversion characteristic be given as exemplified in Table 3 hereunder as regards the device input signal X, the converion levels, and binary representations of the conversion levels in four binary bits.

TABLE 3

| Input Signal X | Conversion Level | Converted Signal W |
| --- | --- | --- |
| 127 | 127 | 0000 |
| 126 | 126 | 0001 |
| 124 to 125 | 125 | 0010 |
| 120 to 123 | 123 | 0011 |
| 112 to 119 | 119 | 0100 |

TABLE 3-continued

| Input Signal X | Conversion Level | Converted Signal W |
|---|---|---|
| 104 to 111 | 111 | 0101 |
| 96 to 103 | 103 | 0110 |
| 0 to 95 | 95 | 0111 |
| −96 to −1 | −96 | 1000 |
| −104 to −97 | −104 | 1001 |
| −112 to −105 | −112 | 1010 |
| −120 to −113 | −120 | 1011 |
| −124 to −121 | −124 | 1100 |
| −126 to −125 | −126 | 1101 |
| −127 | −127 | 1110 |
| −128 | −128 | 1111 |

According to Table 3, the signal value of the device input signal X is quantized into one of the upper values 127, 126, 125, 123, 119, 111, and 103 and the lower values (−128), (−127), (−126), (−124), (−120), (−112), and (−104) of the converted signal W in accordance with a preselected quantization characteristic when the signal value is in the upper region between 127 and 96 or in the lower region between (−128) and (−97). The quantization characteristic is such that a smaller quantization step of 1 or 2 is used when the signal value is near to the upper limit 127 or to the lower limit (−128) and that a greater quantization step of 8 or 4 is used when the signal value is near to the first value 96 or to the second value (−97). In the intermediate region between 95 and (−96), the signal value is quantized into two intermediate values 95 and (−96) in accordance with the quantization characteristic. Use of the preselected quantization characteristic is, however, immaterial insofar as concerned with the intermediate region.

Reviewing Tables 2 and 3, it is now clear that the converted signal W carries information related to the signal value of the device input signal X and that the information is represented by a smaller number of binary bits than the preselected number N used for the input signal X. Such a converting circuit 16 is conveniently implemented by a read-only memory.

Operation will be described in connection with a quantizing device in which Tables 1 and 3 are used for the quantizer 13 and the converting circuit 16. It should be noted that the local decoded signal Y is equal to the device input signal X plus the quantization error Qe.

In a first example, let the device input signal X have a signal value between 120 and 123 and let the quantization output signal Q represent the i-th quantizationlevel Q(i) with a positive level number and with an i-th quantization error Qe(i) which is equal to six. The level number i depends on the differential signal E which, in turn, depends on the prediction characteristic of the predictor 15 and on the manner in which the input signal X varies. In any event, the local decoded signal Y has a value between 126 and 129. Inasmuch as the upper limit of the input signal X is equal to 127, it is possible that the local decoded signal Y upwardly exceeds the upper limit. On the other hand, the converted signal W is represented by a binary number 0011 indicative of one of the upper values. The quantizer 13 therefore adaptively quantizes the differential signal E into an (i−1)-th quantization level Q(i−1) which is one quantization step lower than the i-th quantization level Q(i). An (i−1)-th quantization error Qe(i−1) becomes negative in general. As a result of this adaptive quantization, the local decoded signal Y is given a value in the dynamic range of the input signal X.

In a second example, let the converted signal W have a positive conversion level which is either in the upper region or in the intermediate region and is equal to (127 − Z) where Z is an integer equal to one of 0, 1, 2, 4, 8, 16, 24, and 32 in Table 3. When the quantization error Qe is equal to or less than the integer Z, the quantizer 13 produces the quantization output signal Q with the i-th quantization level Q(i) used with no change as the aforementioned selected level. When the quantization error Qe is greater than the integer Z, the quantization is adaptively carried out to select an (i−j)-th quantization level Q(i−j) as the above-mentioned changed level which is nearest to the selected level Q(i) and is accompanied by an (i−j)-th quantization error Qe(i−j) less than the integer Z. The lowest or the minus tenth level Q(−10) is substituted for the highest or the tenth level Q(10) when the selected level is the tenth level and furthermore when the changed level should be one quantization step higher than the selected level.

In a third example, let the converted signal W have a negative conversion level which is either in the lower region or in the intermediate region and is equal to (−128+Z). When the quantization error Qe is equal to or greater than (−Z), the i-th quanitzation level Q(i) is represented by the quantization output signal Q as the selected level with no change. When the quantization error Qe is less than (−Z), the quantization is adaptively carried out to select an (i+j)-th quantization level Q(i+j) as the changed level which is nearest to the selected level and is accompanied by an (i+j)-th quantization error Qe(i+j) greater than (−Z). The highest or the tenth level Q(10) is substituted for the lowest level Q(−10) when the selected level is the lowest level Q(−10) and moreover when the changed level should be one quantization step lower than the selected level.

For instance, let the device input signal X have a signal value (−118). In this event, the converted signal W has the conversion level (−120). On the other hand, let the differential signal E have a value 127. In response, the quantization output signal Q represents the tenth quantization level Q(10) or 96. Under the circumstances, the tenth quantization error Qe(10) becomes equal to minus thirty-one. When the conversion level (−120) is used, the local decoded signal Y becomes equal to (−151) and downwardly exceeds the lower level (−128). Inasmuch as the selected level is the highest level, the lowest or the minus tenth level Q(−10) is used as the changed level which should be one quantization step higher than the selected level. The quantization level is equal to (−96). The minus tenth quantization error Qe(−10) becomes equal to (−223). This quantization error Qe is, however, calculated with respect to the modulus of eight binary bits, namely, 256. The quantization error Qe therefore becomes equal to thirty-three. The local decoded signal Y has a value which is equal to (−87) and is higher than the lower limit (−128).

Figure 2:
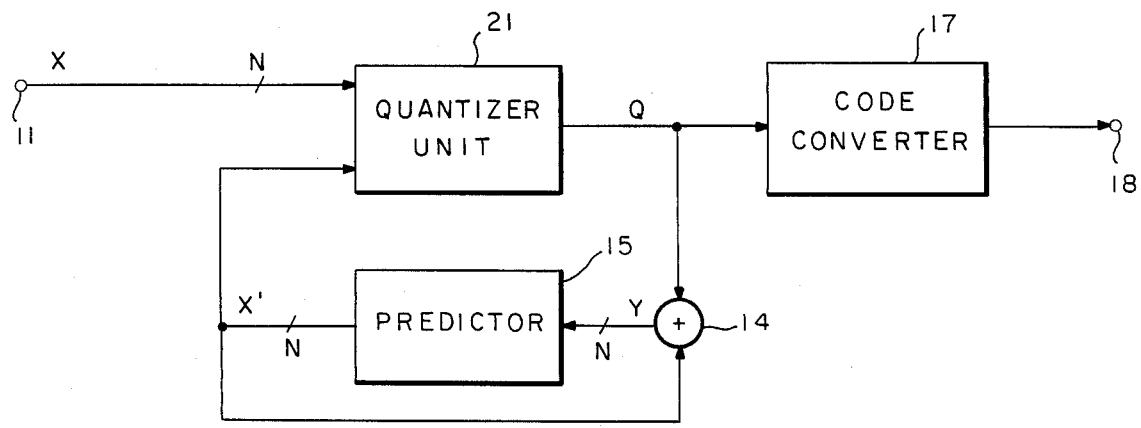
FIG. 2 is a block diagram of a differential encoder which comprises a quantizing device according to a second embodiment of this invention.

Referring now to FIG. 2, a differential encoder comprises a quantizing device according to a second embodiment of this invention. In the manner described in conjunction with Fig. 1, the quantizing device has a device input terminal 11 and comprises a device adder 14 and a predictor 15. The different encoder comprises a code converter 17 and has an encoder output terminal 18. The quantizing device does not comprise the converting circuit 16 (FIG. 1) but a quantizer unit 21 so as to be operable with signals which are of the type described in connection with Fig. 1 and will be designated by like reference symbols.

Figure 3:
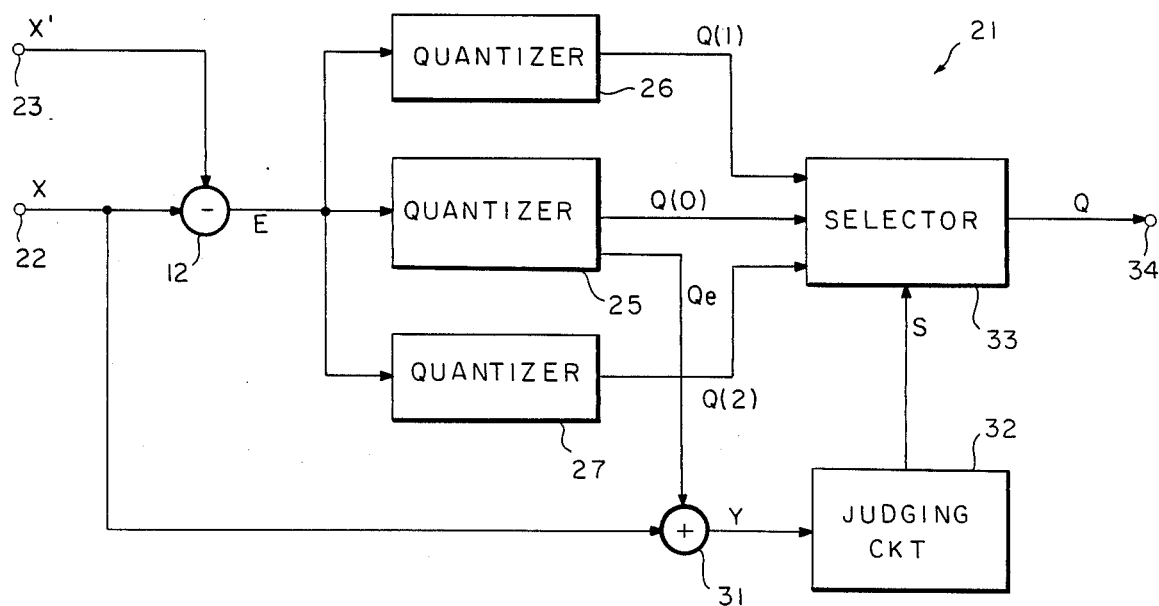
FIG. 3 is a block diagram of a quantizer unit for use in the quantizing device depicted in FIG. 2.

Turning to FIG. 3, the quantizer unit 21 has unit and local input terminals 22 and 23 supplied with the device input signal X through the device input terminal 11 and with the local input signal X' from the predictor 15. A unit subtracter corresponds to the device subtracter 12 described in connection with Fig. 1 and will therefore be designated by the reference numeral 12. Responsive to the device input signal X and the local input signal X', the unit subtracter 12 produces the differential signal E.

A zeroth quantizer 25 is for quantizing the differential signal E into a zeroth quantized signal Q(0) (the reference symbol of the zeroth quantization level being used merely for convenience) representative of a selected one of a predetermined number of quantization levels of a predetermined quantization characteristic that is selected as a selected level in response to each difference represented by the differential signal E. Responsive to the difference, a first quantizer 26 produces a first quantized signal Q(1) (the reference symbol of the first quantization level being used) representative of a lower level which is one quantization step lower than the selected level. Responsive to the difference, a second quantizer 27 produces a second quantized signal Q(2) (the reference symbol of the second quantization level being used) representative of a higher level which is one quantization step higher than the selected level.

Besides the zeroth quantized signal Q(0), an error signal is produced by the zeroth quantizer 25 to represent the quantization error Qe which is equal to the selected level minus the difference. It is therefore understood that an error signal producing arrangement is composed of the zeroth quantizer 25 and a signal line labelled Qe.

Supplied with the device input signal X through the unit input terminal 22 and with the error signal from the error signal producing arrangement, a unit adder 31 produces a local output signal which is identical in practice with the local decoded signal Y and will therefore be denoted by the reference symbol Y. The unit adder 31 may produce the local output signal Y with (N+1) binary bits.

Responsive to the local output signal Y, a judging circuit 32 judges whether or not the local output signal Y exceeds either the upper limit or the lower limit of the input signal X. The judging circuit 32 thereby produces a pointing or switching signal S indicative of a zeroth, a first, and a second pointer when the local output signal Y exceeds neither of the upper and the lower limits, when the local output signal Y upwardly exceeds the upper limit, and when the local output signal Y downwardly exceeds the lower limit, respectively. Such a judging circuit 32 is readily implemented by a read-only memory.

Responsive to the pointing signal S, a selector 33 selects one of the zeroth, the first, and the second quantized signals Q(0), Q(1), and Q(2) as the quantization output signal Q when the pointing signal S indicates the zeroth, the first, and the second pointers, respectively. This quantization output signal Q is delivered from the quantizer unit 21 to the code converter 17 through a unit output terminal 34.

It is now understood that a combination of the error signal producing arrangement, the unit adder 31, the judging circuit 32, and the selector 33 serves as a selecting arrangement responsive to the device input signal X, the local input signal X' or the difference, and the zeroth quantized signal Q(0) for adaptively selecting one of the zeroth, the first, and the second quantized signals Q(0), Q(1), and Q(2) as the quantization output signal Q when the local decoded signal Y does not exceed the dynamic range of the device input signal X even if the quantization error Qe has the greatest absolute value Qa, when it is possible that the local decoded signal Y upwardly exceeds the upper limit, and when it is possible that the local decoded signal Y downwardly exceeds the lower limit, respectively. In this manner, the quantizing device adaptively quantizes the difference into the quantization output signal Q so that the local decoded signal Y never exceeds the dynamic range even if the quantization error Qe has the greatest absolute value Qa.

Figure 4:
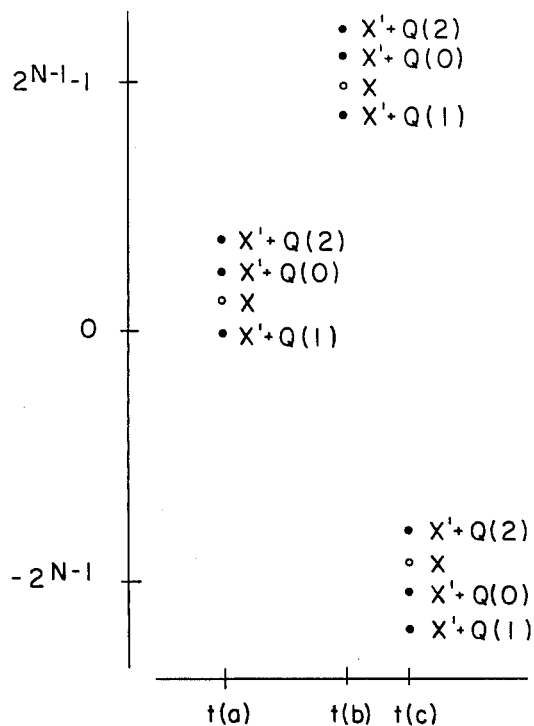
FIG. 4 is a diagram for use in describing operation of the quantizer unit illustrated in FIG. 3.

Further turning to FIG. 4, the abscissa is a time axis along which first through third time instants are shown at t(a), t(b), and t(c). The ordinate shows a value of the device input signal X or of the local decoded signal Y together with the values of zero and the upper and the lower limits $(2^{N-1} -1)$ and $(-2^{N-1})$. For the time instants t(a) through t(c), the input signal X is depicted by white circles. The local decoded signal Y for the selected level Q(0) is indicated by black circles as (X'+Q(0)) along with those which are produced by the use of the lower and the higher levels instead of the selected level.

Operation of the quantizer unit 21 (FIG. 3) will be described. At the first time instant t(a), the local decoded signal (X'+Q(0)) has a value inside the dynamic range. The quantizer unit 21 therefore produces the zeroth quantized signal Q(0) as the quantization output signal Q. At the second time instant t(b), the local decoded signal (X'+Q(0)) upwardly exceeds the upper limit. The quantizer unit 21 consequently produces the first quantized signal Q(1) as the quantization output signal Q so that the device adder 14 (FIG. 2) produces the local decoded signal (X'+Q(1)) below the upper limit by using the lower level. At the third time instant t(c), the local decoded signal (X'+Q(0)) downwardly exceeds the lower limit. As a result, the quantizer unit 21 produces the second quantized signal Q(2) as the quantization output signal Q so that the device adder 14 produces the local decoded signal (X'+Q(2)) above the lower limit with the higher level used.

Figure 5:
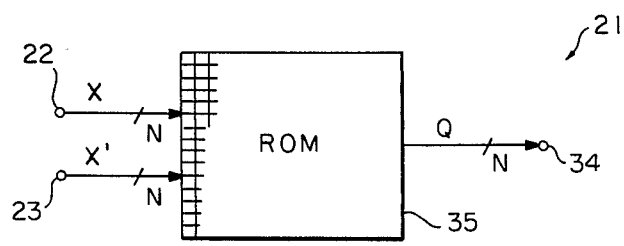
FIG. 5 is a block diagram of another quantizer unit for use in the quantizing device shown in FIG. 2.

Referring to FIG. 5, the quantizer unit 21 is implemented by a read-only memory 35 having a plurality of memory locations or cells indicated by a few small rectangles. The memory locations are selectively accessed by an address signal which is given by a combination of the N-bit device input signal X and the N-bit local input signal X'.

In the manner understood from the description related to FIG. 3, the address signal is related to a plurality of reference quantization levels in accordance with a predetermined quantization characteristic. The error signal for the quantization error Qe is defined by the reference quantization level minus each difference between the device and the local input signals X and X'. When a plurality of different quantization levels are one quantization step different from the respective reference quantization levels, the different quantization levels will be called changed quantization levels. The local decoded signal Y is defined by a sum of the device input signal X and the reference quantization levels.

The reference and the changed quantization levels are preliminarily written in the memory locations of the read-only memory 35. It is now possible by computer simulation to make the address signal access one of the memory locations so that the read-only memory 35 adaptively produce an N-bit memory output signal as the quantization output signal Q thus far described. More particularly, the computer simulation should be such that the quantization output signal Q represents one of the reference quantization levels as a selected level when the local decoded signal Y never exceeds the dynamic range of the device input signal X even if the quantization error Qe has the greatest absolute value Qa and such that the quantization output signal Q adaptively represents one of the changed quantization levels as a changed level when it is possible that the local decoded signal Y exceeds the dynamic range.

Reviewing FIGS. 1 through 3 and 5, it may be mentioned here that various read-only memories are available on the market. It is readily possible at present to select a read-only memory which is accessible by a twelve-bit address signal to produce a four-bit memory output signal with a memory access speed of 35 nanoseconds. Such a read-only memory is conveniently used on implementing the quantizer 13, the converting circuit 16, each of the zeroth through the second quantizers 25 to 27, and the read-only memory 35. For example, two of such read-only memories are sufficient for use as the quantizer 13. The zeroth quantizer 25 should be loaded with the quantization error Qe in addition to each of the reference quantization levels. For use as the quantizer 13, the read-only memory is simpler than those for use as the zeroth through the second quanizers 25 to 27 or as the read-only memory 35.

Figure 6:
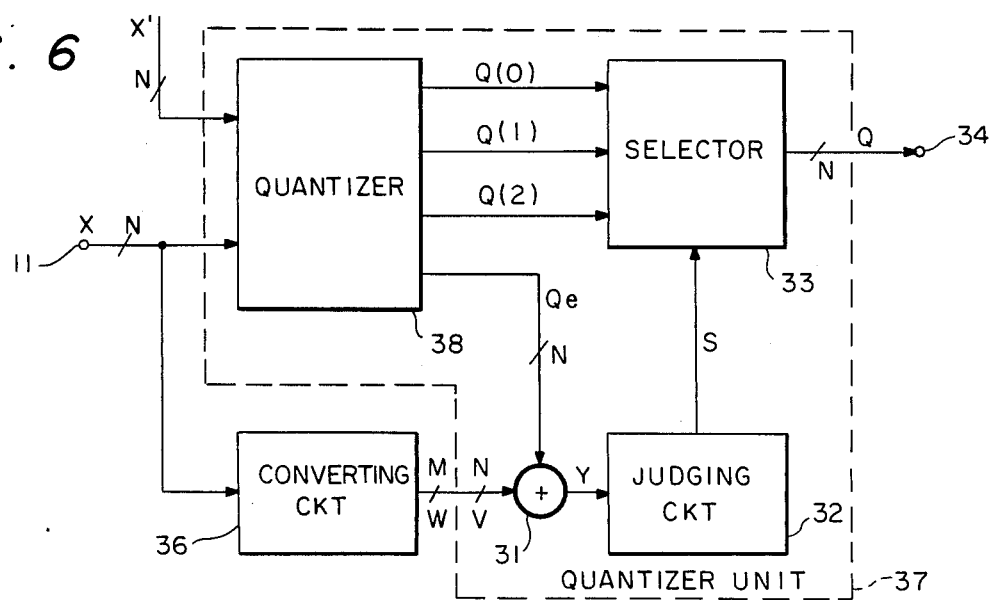
FIG. 6 shows a block diagram of a quantizing device in order to describe the relationship between the quantizing devices illustrates in FIGS. 1 and 2.

Referring finally to FIG. 6, it is possible to understand that the quantizing device described in conjunction with FIG. 1, is a modification of the quantizing device described in connection with FIGS. 2 through 4. More specifically, the quantizing device of FIG. 1 is equivalent to a quantizing device having a device input terminal 11 and comprising a converting circuit 36 and a quantizer unit 37 which has a unit output terminal 34 and is of the type illustrated with reference to FIG. 3. The quantizer unit 37 therefore comprises, in turn, a unit adder 31, a judging circuit 32, a selector 33, and a quantizer 38. The quantizer 38 comprises three quantizers and a device subtracter which are equivalent to the quantizer 25-27 and the device subtracter 12 show in FIG. 3. The quantizer 38; is responsive to the device input signal X and the local input signal X' for producing the zeroth through the second quantized signals Q(0), Q(1), and Q(2) and the error signal for the zeroth quantized signal Q(0) which is representative of the quantization error Qe.

When the device input signal X is an eight-bit signal and moreover when the quantization error Qe has a greatest absolute value Qa which is equal to seven, the converting circuit 36 should produce a four-bit converted signal W in response to the input signal X in accordance with a conversion characteristic exemplified below in Table 4 as a preselected quantization characteristic.

TABLE 4

| Input Signal X | Conversion Level V | New Column Converted Signal W |
|---|---|---|
| 127 | 127 | 0000 |
| 126 | 126 | 0001 |
| 125 | 125 | 0010 |
| 124 | 124 | 0011 |
| 123 | 123 | 0100 |

TABLE 4-continued

| Input Signal X | Conversion Level V | New Column Converted Signal W |
|---|---|---|
| 122 | 122 | 0101 |
| 121 | 121 | 0110 |
| −121 to 120 | 0 | 0111 |
| −122 | −122 | 1000 |
| −123 | −123 | 1001 |
| −124 | −124 | 1010 |
| −125 | −125 | 1011 |
| −126 | −126 | 1100 |
| −127 | −127 | 1101 |
| −128 | −128 | 1110 |

In the quantizer unit 37, the converted signal W is reverted to a conversion level V in accordance with a reverting characteristic described in Table 4.

Instead of the device input signal X, the converted level V is used in the unit adder 31 in producing the local output signal which serves as the local decoded signal Y. In response to the local output signal Y the judging circuit 32 produces the pointing signal S with two binary bits. When the converted signal V represents zero, the pointing signal S indicates zero as the zeroth pointer. Otherwise, the pointing signal S indicates either the first or the second pointer according to a result of judgement carried out on the local decoded signal Y in comparison with the upper and the lower limits of the input signal X.

While this invention has so far described in specific conjunction with a few preferred embodiments thereof, it will now be readily possible for one skilled in the art to put this invention into practice in various other manners. For example, the converting circuit 16 may compare bit patterns of the device input signal X with preselected reference bit patterns on producing the converter signal W.

What is claimed is:

1. A quantizing device comprising:
   subtracting means for calculating a difference between a device input signal representing a signal value variable between predetermined upper and lower limits and a local input signal;
   quantizing means for quantizing, in accordance with a predetermined quantization characteristic, said difference into a quantization output signal with a quantization error which represents a result of subtracting said difference from said quantization output signal;
   adder means for calculating a sum of said quantization output signal and said local input signal to produce a local decoded signal representative of said sum;
   predictor means responsive to said local decoded signal for producing said local input signal which is predictive of said device input signal;
   converting means for converting said device input signal to a converted signal representative of upper values and lower values when said signal value is in an upper region between said upper limit and a first value which is equal to said upper limit less a maximum value of said quantization error determined by said predetermined quantization characteristic and when said signal value is in a lower region between said lower limit and a second value which is equal to said lower limit plus said maximum value, respectively, said converted signal representing at least one intermediate value when said signal value is in an intermediate region which is neither said upper region nor said lower region; and said quantizing means responsive to said converted signal for quantizing said difference into said quantization output signal in accordance with said predetermined quantization characteristic with no change and with an adaptive change when said converted signal represents said at least one intermediate value and when said converted signal represents either of said upper values and said lower values, respectively, said adaptive change being in compliance with said upper and said lower values so that said local decoded signal never exceeds said upper and lower limits even if said quantization error has said maximum value.

2. A quantizing device as claimed in claim 1, said difference being variable between a greatest value and a least value, said predetermined quantization characteristic being for making said quantization output signal represent for said difference a selected one of a predetermined number of quantization levels that becomes a highest level and a lowest level when said difference is equal to said greatest and said least values, respectively, wherein said adaptive change is for making said quantization output signal represent a changed one of said quantization levels that is one quantization step lower and higher than said selected one of the quantization levels when it is possible that said local decoded signal upwardly exceeds said upper limit and downwardly exceeds said lower limit, respectively.

3. A quantizing device as claimed in claim 1, said difference being variable between a greatest value and a least value, said predetermined quantization characteristic being for making said quantization output signal represent for said difference a selected one of a predetermined number of quantization levels as a selected level, wherein said adaptive change is for making said quantization output signal represent a changed one of said quantization levels as a changed level for said difference that is one quantization step different from said selected level in compliance with said upper and said lower values so that said local decoded signal never exceeds said upper and lower limits even if said quantization error has said maximum.

4. A quantizing device as claimed in claim 3, said signal value being represented by a preselected number of binary bits, said adder means being for calculating said sum modulo $2^N$, where N represents said preselected number, said selected level becoming a highest level and a lowest level among said quantization levels when said difference is equal to said greatest and said least values, respectively, wherein said adaptive change is to substitute said lowest level for said highest level when said selected level becomes said highest level and furthermore when it is possible that said local decoded signal upwardly exceeds said upper limit, said adaptive change being to substitute said highest level for said lowest level when said selected level becomes said lowest level and furthermore when it is possible that said local decoded signal downwardly exceeds said lower limit.

5. A quantizing device as claimed in claim 1, wherein said converting circuit is for making said converted signal represent said signal value as one of said upper values and said lower values when said signal value is in said upper and said lower regions, respectively.

6. A quantizing device as claimed in claim 1, wherein said converting circuit is for quantizing said signal value into one of said upper values and said lower values in accordance with a preselected quantization characteristic when said signal value is in said upper and said lower regions, respectively.

7. A quantizing device as claimed in claim 6, wherein said preselected quantization characteristic is such that said signal value is quantized into said one of the upper values and the lower values with a smaller quantization step and a greater quantization step when said signal value is near to either of said upper and said lower limits and when said signal value is near to either of said first and said second values, respectively.

8. A quantizing device as claimed in claim 1, wherein said quantizing means comprises:

a zeroth quantizer for quantizing said difference into a zeroth quantized signal representative of a selected one of a predetermined number of quantization levels in accordance with a predetermined quantization characteristic;

a first quantizer for quantizing said difference into a first quantized signal representative of a lower level which is one quantization step lower than said selected one of the quantization levels;

a second quantizer for quantizing said difference into a second quantized signal representative of a higher level which is one quantization step higher than said selected one of the quantization levels; and selecting means responsive to said device input signal, said difference, and said zeroth quantized signal for adaptively selecting one of said zeroth, said first, and said second quantized signals as said quantization output signal that said local decoded signal never exceeds said upper and lower limits even if said quantization error has said maximum value, when it is possible that said local decoded signal upwardly exceeds said upper limit, and when it is possible that said local decoded signal downwardly exceeds said lower limit, respectively.

9. A quantizing device as claimed in claim 8, wherein said selecting means comprises:

means responsive to said difference and said zeroth quantized signal for producing an error signal representative of said quantization error;

means responsive to said device input signal and said error signal for producing a local output signal which is substantially identical with said local decoded signal;

judging means responsive to said local output signal for judging whether or not said local decoded signal exceeds either of said upper and said lower limits, said judging means thereby producing a pointing signal indicative of a zeroth, a first, and a second pointer when said local decoded signal exceeds neither of said upper and said lower limits, when it is possible that said local decoded signal upwardly exceeds said upper limit, and when it is possible that said local decoded signal downwardly exceeds said lower limit, respectively; and means responsive to said pointing signal for selecting one of said zeroth, said first, and said second quantized signals as said quantization output signal when said pointing signal indicates said zeroth, said first, and said second pointers, respectively.

10. A quantizing device as claimed in claim 8, said device input signal being represented by a preselected number of binary bits, said difference being variable between a greatest value and a least value, said predetermined quantization characteristic being for making said zeroth quantized signal represent a highest and a lowest level of said quantization levels when said difference is equal to said greatest and said least values, respectively, said adder being for calculating said sum modulo $2^N$, where N represents said preselected number, wherein:

said first quantizer is for making said first quantized signal represent said highest level as said lower level when said zeroth quantized signal represents said highest level and furthermore when it is possible that said local decoded signal upwardly exceeds said higher limit;

said second quantizer being for making said second quantized signal represent said lowest level as said higher level when said zeroth quantized signal represents said lowest level and furthermore when it is possible that said local decoded signal downwardly exceeds said lower limit.

11. A quantizing device as claimed in claim 8, wherein said quantizing means is a read-only memory having a plurality of memory locations which are selectively accessed by an address signal and at which a plurality of reference quantization levels and a plurality of changed quantization levels are preliminarily stored, said reference quantization levels being related to said difference in accordance with a predetermined quantization characteristic, said changed quantization levels being one quantization step different from the respective reference quantization levels, said device input signal and said local input signal being collectively used as said address signal in making said read-only memory produce said quantization output signal with said quantization output signal made to adaptively represent one of said reference quantization levels and represent one of said changed quantization levels in response to said difference when a sum of said device input signal and said one of the reference quantization levels never exceeds said upper and lower limits even if said quantization error has said maximum value and when it is possible that the last-mentioned sum exceeds said upper and lower limits, respectively.

* * * * *